(12) United States Patent
Wang et al.

(10) Patent No.: US 9,024,295 B2
(45) Date of Patent: May 5, 2015

(54) NANOWIRE PHOTODETECTOR AND IMAGE SENSOR WITH INTERNAL GAIN

(71) Applicant: The Regents of the University of California, Oakland, CA (US)

(72) Inventors: Deli Wang, San Diego, CA (US); Cesare Soci, La Jolla, CA (US); Yu-Hwa Lo, San Diego, CA (US); Arthur Zhang, San Diego, CA (US); David Aplin, Cambridgeshire (GB); Lingquan Wang, Santa Clara, CA (US); Shadi Dayeh, Los Alamos, NM (US); Xin Yu Bao, Mountain View, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 13/793,545

(22) Filed: Mar. 11, 2013

(65) Prior Publication Data

US 2014/0103295 A1 Apr. 17, 2014

Related U.S. Application Data

(63) Continuation of application No. 12/528,701, filed as application No. PCT/US2008/002529 on Feb. 26, 2008, now Pat. No. 8,440,997.

(60) Provisional application No. 60/903,633, filed on Feb. 27, 2007, provisional application No. 60/903,750, filed on Feb. 27, 2007.

(51) Int. Cl.
*H01L 31/00* (2006.01)
*H01L 31/0352* (2006.01)
(Continued)

(52) U.S. Cl.
CPC ........ *H01L 31/035227* (2013.01); *B82Y 20/00* (2013.01); *H01L 27/14643* (2013.01); *H01L 31/035236* (2013.01)

(58) Field of Classification Search
CPC .................................................. H01L 21/02603
USPC ....................... 438/689, 694; 257/414, E1.17
See application file for complete search history.

(56) References Cited

U.S. PATENT DOCUMENTS

| 6,882,767 B2 | 4/2005 | Yang et al. |
| 2003/0121764 A1 | 7/2003 | Yang et al. |

(Continued)

FOREIGN PATENT DOCUMENTS

| EP | 0 951 178 | 4/1999 |
| EP | 1748494 | 1/2007 |

OTHER PUBLICATIONS

Chang et al., "High performance ZnO nanowrie field effect transistors", *Applied Physics Letters*, vol. 89, 2006, p. 133113.

(Continued)

*Primary Examiner* — Mark A Laurenzi
(74) *Attorney, Agent, or Firm* — Greer, Burns & Crain, Ltd.

(57) ABSTRACT

A 1D nanowire photodetector device includes a nanowire that is individually contacted by electrodes for applying a longitudinal electric field which drives the photocurrent. An intrinsic radial electric field to inhibits photo-carrier recombination, thus enhancing the photocurrent response. Circuits of 1D nanowire photodetectors include groups of photodetectors addressed by their individual 1D nanowire electrode contacts. Placement of 1D nanostructures is accomplished with registration onto a substrate. A substrate is patterned with a material, e.g., photoresist, and trenches are formed in the patterning material at predetermined locations for the placement of 1D nanostructures. The 1D nanostructures are aligned in a liquid suspension, and then transferred into the trenches from the liquid suspension. Removal of the patterning material places the 1D nanostructures in predetermined, registered positions on the substrate.

12 Claims, 7 Drawing Sheets

(51) Int. Cl.
    *B82Y 20/00*      (2011.01)
    *H01L 27/146*     (2006.01)

(56) References Cited

U.S. PATENT DOCUMENTS

| | | | |
|---|---|---|---|
| 2004/0055892 A1* | 3/2004 | Oh et al. | 205/109 |
| 2005/0184641 A1* | 8/2005 | Armitage et al. | 313/495 |
| 2006/0054982 A1 | 3/2006 | Yang et al. | |
| 2006/0175601 A1 | 8/2006 | Lieber et al. | |
| 2006/0214683 A1* | 9/2006 | DeHon | 326/41 |
| 2006/0250856 A1 | 11/2006 | Bertin et al. | |
| 2006/0289761 A1 | 12/2006 | Nabet et al. | |
| 2007/0026645 A1 | 2/2007 | Lieber et al. | |
| 2007/0155025 A1 | 7/2007 | Zhang et al. | |
| 2007/0196239 A1 | 8/2007 | Vink et al. | |

OTHER PUBLICATIONS

Chang-Hasnain, "Nanowire Photonics I: FETs and LEDs", *Center for optoelectronic nanostructured semiconductor technologies*, Nov. 2005.
Cui et al., "Ultrasensitive and selective multiplexing detection of cancer markers using nanowire nanosensors", Oct. 2005, vol. 23, 10 1294.
Duan et al., "Single-nanowire electrically driven lasers", *Nature*, vol. 421, Jan. 16, 2003, pp. 241-245.
Gradecak et al., "GaN nanowire lasers with low lasing thresholds, *Applied Physics Letters*", vol. 87, 2005, 173111.
Gu et al., "Near-field scanning photocurrent microscopy of a nanowire photodetector", *Applied Physics Letters*, vol. 87, 2005, 043111.
Hayden et al., "Nanoscale avalanche photodiodes for highly sensitive and spatially resolved photon detection", *Nature Materials*, vol. 5, May 2006, pp. 352-356.
Law et al., "Nanoribbon waveguides for subwavelength photonics integration", *Science*, vol. 305, Aug. 27, 2004, pp. 1269-1273.
Li et al., "Nanowire Electronic and Optoelectgronic Devices", *Materials Today*, vol. 9, No. 10, Oct. 2006, pp. 18-27.
Lu et al., "Ultraviolet photodetectors with ZnO nanowires prepared on ZnO:Ga/glass templates", *Applied Physics Letters*, vol. 89, 2006, pp. 153101.
Lu et al, "Quasi-one-dimensional metal oxide materials—Synthesis, properties and applications", *Materials Science and Engineering*, vol. 52, 2006, pp. 49-91.
Mieszawska et al., "Gold nanorods grown directly on surfaces from microscale patterns of gold seeds", *Chem. Mater.*, vol. 17, No. 13, 2005, pp. 3415-3420.
Servati et al., "Scalable silicon nanowire photodetectors", *Science Direct*, vol. 38, 2007, pp. 64-66.
Singh et al., "Polarization-sensitive nanowire photodetectors based on solution-synthesized CdSe quantum-wire solids", *Nano Letters*, vol. 0, No. 0, Aug. 31, 2007.
Singh et al., "Polarization-sensitive photodetectors based on electric field-aligned semiconductor nanowires", Abstract submitted to LEC, 2006.
Singh et al., "Field-effect transistors and photodetectors based on solution-synthesized nanowires", Abstract submitted to DRC, 2006.
Sirbuly et al, "Semiconductor nanowires for subwavelength photonics integration", *J. Phys. Chem. B*, vol. 109, 2005, pp. 15190-15213.
Wang et al., "Highly polarized photoluminescence and photodetection from single indium phosphide nanowires", *Science*, vol. 293, Aug. 24, 2001, pp. 1455-1457.
Whang et al., "Nanolithography using hierarchically assembled nanowire masks", *Nano Letters*, vol. 3, No. 7, 2003, pp. 951-954.
Zheng et al., "Electronic Properties of Silicon Nanowires", pp. 101-115, unknown date.
The Editors of *Technology Research News*, et. al., "Semiconductor Nanowires Tiniest Wires to Transform Chips, Lasers, Sensors", *Technology Research News*, Aug. 2006.

Dohler, G., "Doping superlattices ("n-i-p-i crystals")", *IEEE Journal of Quantum Electronics*, vol. 22, No. 9, 1986, pp. 1682-1695.
Fan, Z.Y., et al., "Photoluminescence and polarized photodetection of single ZnO nanowires", *Applied Physics Letters*, vol. 85, No. 25, 2004, pp. 6128-6130.
Futako, W., et al., "Photoconductivity gain over 10 at a large electric field in wide gap a-SiH", *Journal of Non-Crystalline Solids*, vol. 230, 1998, pp. 220-224.
Goldberger, J., et al., "ZnO nanowire transistors", *Journal of Physical Chemistry B*, vol. 109, No. 1, 2005, pp. 9-14.
Heo, Y.W., et al., "Electrical transport properties of single ZnO nanorods", *Applied Physics Letters*, vol. 85, No. 11, 2004, pp. 2002-2004.
Heo, Y.W., et al., "UV photoresponse of single ZnO nanowires", *Applied Physics A: Materials Science & Processing*, vol. 80, No. 3, 2005, pp. 497-499.
Hsu, C.-L., et al., "Ultraviolet photodetectors with low temperature synthesized vertical ZnO nanowires", *Chemical Physics Letters*, vol. 416 Nos. 1-3, 2005, pp. 75-78.
Jie, J.S., et al., "Photoconductive characteristics of single-crystal CdS nanoribbons", *Nanoletters*, vol. 6, No. 9, 2006, pp. 1887-1892.
Karpina, V.A., et al., "Zinc oxide—analogue of GaN with new perspective possibilities", *Crystal Research and Technology*, vol. 39, No. 11, 2004, pp. 980-992.
Katz, O., et al., "Gain mechanism in GaN Schottky ultraviolet detectors", *Applied Physics Letters*, vol. 79, No. 10, 2001, pp. 1417-1419.
Keem, K., et al., "Photocurrent in ZnO nanowires grown from Au electrodes", *Applied Physics Letters*, vol. 84, No. 22, 2004, pp. 4376-4378.
Kim, H.K., et al., "Electrical and structural properties of Ti/Au ohmic contacts to n-ZnO", *Journal of the Electrochemical Society*, vol. 148, No. 3, 2001., pp. G114-G117.
Kind, H., et al., "Nanowire ultraviolet photodetectors and optical switches", *Advanced Materials* (Weinheim, Germany), vol. 14, No. 2, 2002., pp. 158-160.
Konenkamp, R., R.C. Word, and C. Schlegel, "Vertical nanowire light-emitting diode", *Applied Physics Letters*, vol. 85, No. 24, 2004., pp. 6004-6006.
Kumar, S., V. Gupta, and K. Sreenivas, "Synthesis of photoconducting ZnO nano-needles using an unbalanced magnetron sputtered ZnO/Zn/ZnO multilayer structure", *Nanotechnology*, vol. 6, No. 8, 2005, pp. 1167-1171.
Law, J.B.K. and J.T.L. Thong, "Simple fabrication of a ZnO nanowire photodetector with a fast photoresponse time", *Applied Physics Letters*, vol. 88, No. 13, 2006, p. 133114.
Li, Q.H., et al., "Adsorption and desorption of oxygen probed from ZnO nanowire films by photocurrent measurements", *Applied Physics Letters*, vol. 86, No. 12, 2005, pp. 123117/1-123117/3.
Li, Q.H., et al., "Electronic transport through individual ZnO nanowires", *Applied Physics Letters*, vol. 84, No. 22, 2004, pp. 4556-4558.
Li, Q.H., et al., "Oxygen sensing characteristics of individual ZnO nanowire transistors", *Applied Physics Letters*, vol. 85, No. 26, 2004, pp. 6389-6391.
Luo, L., et al., "Fabrication and characterization of ZnO nanowires based UV photodiodes", *Sensors and Actuators A—Physical*, vol. 127, No. 2, 2006, pp. 201-206.
Matsuo, N., H. Ohno, and H. Hasegawa, "Mechanism of High-Gain in Gaas Photoconductive Detectors under Low Excitation", *Japanese Journal of Applied Physics Part 2—Letters*, vol. 23, No. 5, 1984, pp. L299-L301.
Mehta, R.R. and B.S. Sharma, "Photoconductive Gain Greater Than Unity in CdSe Films with Schottky Barriers at Contacts", *Journal of Applied Physics*, vol. 44, No. 1, 1973, pp. 325-328.
Ng, H.T., et al., "Single crystal nanowire vertical surround-gate field-effect transistor", *Nano Letters*, vol. 4, No. 7, 2004, pp. 1247-1252.
Ozgur, U., et al., "A comprehensive review of ZnO materials and devices", *Journal of Applied Physics*, vol. 98, No. 4, 2005, pp. 041301.
Pauzauskie, P.J. and P. Yang, "Nanowire photonics", *Materials Today*, vol. 9, No. 10, 2006., pp. 36-45.

(56) References Cited

OTHER PUBLICATIONS

Suehiro, J., et al., "Dielectrophoretic fabrication and characterization of a ZnO nanowirebased UV photosensor", *Nanotechnology*, vol. 17, No. 10, 2006, pp. 2567-2573.

Takahashi, Y., et al., "Photoconductivity of Ultrathin Zinc-Oxide Films", *Japanese Journal of Applied Physics*, vol. 33, No. 12A, 1994, pp. 6611-6615.

Vilcot, J.P., et al., "Temperature Effects on High-Gain Photoconductive Detectors", Electronics Letters, vol. 20, No. 2, 1984., pp. 86-88.

Wang, Z.L., "Functional oxide nanobelts: Materials, properties and potential applications in nanosystems and biotechnology", *Annual Review of Physical Chemistry*, vol. 55, 2004, pp. 159-196.

Soci, C., et. al., "Nanowire Photodetectors", *Journal of Nanoscience and Nanotechnology*, vol. 10, pp. 1-20, 2010.

Xiang, Bin, et.al., "Rational Synthesis of p-Type Zinc Oxide Nanowire Arrays Using Simple Chemical Vapor Deposition", *Nano Letters*, vol. 7, No. 2, pp. 323-328, 2007, Published on Web Dec. 26, 2006.

\* cited by examiner

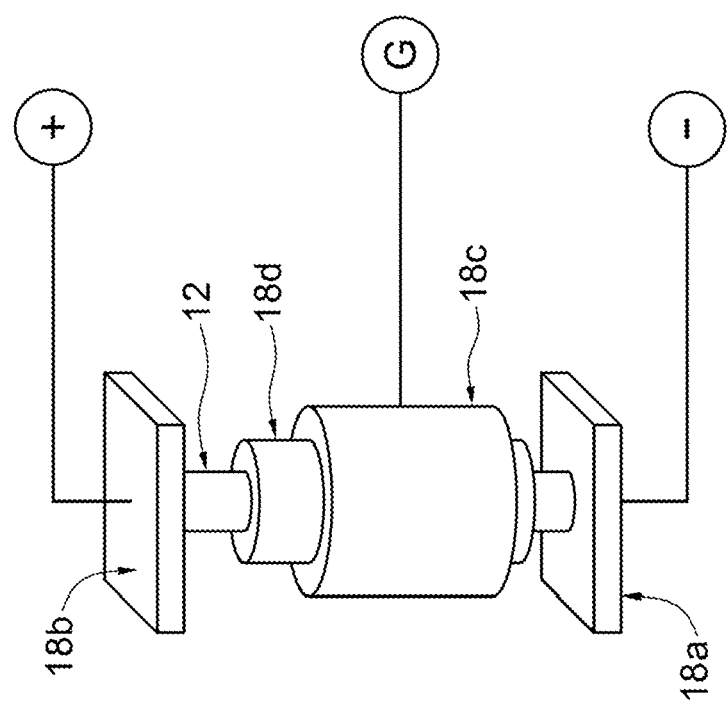

NANOWIRE PHOTODETECTOR AND IMAGE SENSOR WITH INTERNAL GAIN

PRIORITY CLAIM AND REFERENCE TO RELATED APPLICATION

This application is a continuation of and claims priority under 35 U.S.C. §120 from prior co-pending application Ser. No. 12/528,701, filed Jun. 14, 2010, now U.S. Pat. No. 8,440, 997, which was a §371 of PCT US/08/02529, filed Feb. 26, 2008, which claims priority under 35 U.S.C. §119 from prior provisional application Ser. No. 60/903,633, which was filed on Feb. 27, 2007; and from prior provisional application Ser. No. 60/903,750, which was filed on Feb. 27, 2007.

STATEMENT OF GOVERNMENT INTEREST

This application was made with Government support under ECS-0506902 awarded by the National Science Foundation and under N00014-05-1-0149 awarded by the Office of Naval Research. The Government has certain rights in this invention.

FIELD

A field of the invention is photodetection and image sensing. The invention concerns photodetector and image sensors that convert optical signals into electrical signals.

BACKGROUND

Any electronic device that detects and/or processes optical signals must convert the sensed signals to electrical signals. This is accomplished with a photodetector. Image sensors include a spatial arrangement of photodetectors (pixels) that can be used to record and reconstruct an image. Image sensors are used in a wide variety of applications, e.g., toys, games, cameras, medical equipment, security equipment, process monitoring, portable handsets, personal digital assistants, scientific instruments, etc. The modern types of image sensors include charge coupled devices (CCDs) and CMOS (Complementary Metal Oxide Semiconductor) image sensors (also referred to as active pixel sensors).

A CCD sensor includes an array of linked, or coupled, light-sensitive capacitors. A CCD gets its name from the way the charges on its pixels are read after an exposure. After the exposure the charges on the first row are transferred to a place on the sensor called the read out register. From there, the signals are fed to an amplifier and then on to an analog-to-digital converter. The CCD shifts one whole row at a time into the readout register. The readout register then shifts one pixel at a time to the output amplifier.

CMOS image sensors are fabricated on semiconductor substrates, using the CMOS fabrication process used to manufacture computer processors and memories. Pixels in CMOS image sensors have their own charge-to-voltage conversion. In a typical CMOS pixel there is a photodetector, typically a photodiode or photogate, and a number of transistor devices. The photodetector can be reset when it is effectively connected to the power supply through a reset transistor. Another transistor typically acts as a buffer and allows the pixel voltage to be observed without removing the accumulated charge. A row-select transistor is a switch that allows a single row of the pixel array to be read by read-out electronics. In a typical CMOS image sensor, the pixels are arranged in a two-dimensional row and column arrangement. Pixels in a given row share reset lines permitting a row to be reset. Pixels are also selected by row. Outputs of each pixel in any given column are tied together. As one row is selected at a time no competition for the output line occurs. Further amplifier circuitry is typically on a column basis. The CMOS image sensor itself typically includes integrated circuits, e.g., column amplifier circuitry and read out electronics, which permit the CMOS image sensor to output digital bits.

CCDs were once considered the benchmark for obtaining the highest image quality in demanding applications such as medical imaging and digital photography. Compared to early CMOS image sensors, CCDs had better uniformity, and could provide greater resolution and fill factor. However, as the feature size of CMOS fabrications has been reduced, CMOS image sensors have improved to the point that they can be used in demanding imaging applications.

Photodetector and photogates in CMOS images sensors are fabricated through ion implantation, etching, deposition, etc. processing steps. CMOS image sensors are more likely than CCD images sensors to suffer from fixed-pattern and dark-current noise. CCDs also tend to have superior dynamic range. CMOS image sensors can generally be manufactured less expensively. In addition, most image-sensor support circuitry is CMOS based, so it can be integrated on the same chip as a CMOS image sensor, which lowers overall system cost and size. Also, CMOS image sensors do not require multiple voltages for readouts as do CCDs, so they typically consume only a fraction of the power of a comparable CCD image sensor. Further improvements in CMOS style sensors could have a significant positive impact on devices that make use of them.

Efforts have been directed toward the use of nanowires as photodetectors. Nanowires have been recognized as having the potential to be highly sensitive photodetectors and could represent a great advance in CMOS image sensors. However, the incorporation of nanowires as photodetectors in practical CMOS integrations has proven difficult. Additionally, the photon absorption, gain and current generation in nanowires are not fully understood.

For example, under UV illumination, it has been observed that photogenerated holes in ZnO nanowires oxidize surface oxygen species. This transient response of nanowires or how to control it is not fully understood. See, e.g., Lu et al., "Ultraviolet Photodetectors with ZnO Nanowires Prepared on ZnO:Ga/Glass Templates", App. Phys. Lett. 89, 153101 (2006). Others have observed the oxygen sensitivity of ZnO nanowires, which may be used, for example, for gas sensing applications. See, Fan et al, "ZnO Nanowire Field Effect Transistor and Oxygen Sensing Property", Applied Physics Letters 85, 5932 (2004).

Another issue in making practical use of nanowires as photodetctors involves the placement of nanowires and connecting into integrated circuits. While nanowires have been used in groups to realize photodetection and can be deposited in parallel by the standard Langmuir-Blodgett technique for this purpose, the registered placement and registration of nanowires necessary for complex image sensor circuits is lacking.

Fluidic assisted alignment, electrical (electrophoresis) and magnetic field guided alignment, and Langmuir-Blodgett technique, have been used previously to assemble nanowires on the surface of liquids in a well-aligned fashion, similar to nematic phase liquid crystals, and consequently transferred to the surface of solid substrates while maintaining their alignment/organization.

These techniques do not provide for the registered placement of a 1D nanostructure, however. The Langmuir-Blodgett technique as used in the art does not allow the precise control resulting nanowire location and the registration of nanowires on a substrate. Similarly, fluidic alignment cannot achieve precise control of the nanowire location and registration on a substrate, and also cannot be used with large substrates, limiting its applicability to very small scales. On the other hand, the electrophoretic technique does not work on the large scale and requires applying an electric or magnetic field to guide the nanowire assembly.

However, microbeads and nanoparticles have been placed precisely on a substrate by using either the Langmuir-Blodgett technique or self-assembly techniques combined with photolitography to predefine the pockets where the nanoparticles are going to be positioned. See Yin, et.al., J. Am. Chem. Soc. 2001, 123, 8718 and Cui, et.al. *Nano Letters* 4(6); 1093-1098 (2004).

SUMMARY OF THE INVENTION

The invention provides a practical 1D nanowire photodetector with high gain that can be controlled by a radial electric field established in the 1D nanowire. A 1D nanowire photodetector device in embodiments of the invention includes a nanowire that is individually contacted by electrodes for applying a longitudinal electric field that drives the photocurrent. An intrinsic electric field in the radial direction of the nanowire inhibits photo-carrier recombination, thus enhancing the photocurrent response. The invention further provides circuits of 1D nanowire photodetctors, with groups of photodetectors addressed by their individual 1D nanowires electrode contacts. The invention also provides a method for placement of 1D nanostructures, including nanowires, with registration onto a substrate. A substrate is coated with patterning material, e.g., photoresist, and trenches are formed in the patterning material at predetermined locations for the placement of 1D nanostructures. The 1D nanostructures are aligned in a liquid suspension, and then transferred into the trenches from the liquid suspension. Removal of the patterning material leaves the 1D nanostructures in predetermined, registered positions on the substrate.

BRIEF DESCRIPTION OF THE DRAWINGS

FIG. 6C shows a phototransistor device according to additional embodiments of the invention.

DETAILED DESCRIPTION OF THE PREFERRED EMBODIMENTS

Figure 1C:
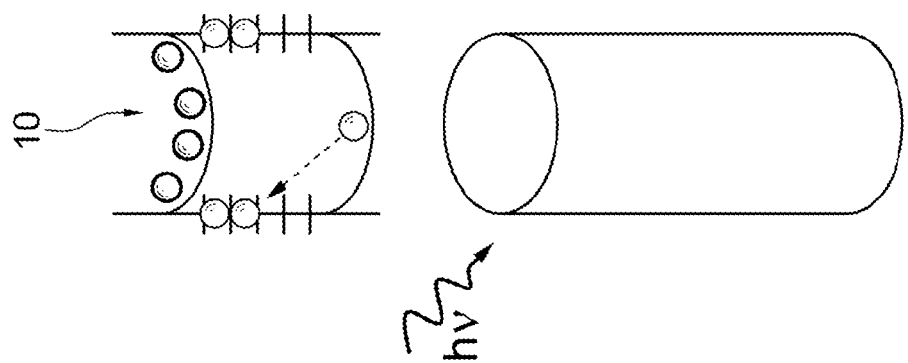
FIGS. 1A-1C illustrate a 1D nanowire photodetector 10 of the invention with high internal gain.

The invention provides a practical 1D nanowire photodetector with high gain that can be controlled by a radial electric field established in the 1D nanowire. A 1D nanowire photodetector device of the invention includes a nanowire that is individually contacted by electrodes for applying a longitudinal electric field which drives the photocurrent. An intrinsic radial electric field to the nanowire inhibits photo-carrier recombination, thus enhancing the photocurrent response. The invention further provides circuits of 1D nanowire photodetctors, with groups of photodetectors addressed by their individual 1D nanowires electrode contacts.

1D nanowire photodetectors with internal gain of the invention can be realized with different materials, including group IV, III-V, II-VI semiconductors. A preferred 1D nanowire photodetector is a ZnO nanowire with a radial doping profile that inhibits hole and electron recombination. Embodiments of the invention provide the ability to integrate group IV, III-V, II-VI semiconductor nanowires as photodetectors with current CMOS image sensor technology for higher sensitivity, higher resolution and lower power consumption image sensors.

In preferred methods for controlling gain of the invention, a radial electric field is created in a 1D nanowire that inhibits hole and electron recombination. The inhibition of recombination increases carrier lifetime and produces high photoconductive gain 1D nanowire photodetectors. Gain control in the invention can be realized via the material structure in a 1D nanowire, such as having a core portion and a shell portion of the nanowire doped differently or have heterostructures with different composition, for example. Additionally, a passivation outer layer on the nanowire can act to control the radial fields that inhibit carrier recombination during stimulation by incident light. The inhibition of recombination increases the sensitivity of the nanowire photodetector significantly and results in internal gain. The photoconductive gain of a photodetector is given by the ratio of the carrier lifetime and the carrier transit time in the active area of the device.

The invention also provides circuits of 1D nanowire photodetctors that are individually addressed. Registered placement for the necessary registration of nanowires to achieve circuits of individual 1D nanowire photodetectors is provided.

The invention provides a method for placement of 1D nanostructures with registration. Example nanostructures include nanowires, nanotubes, and nanobelts, etc. Embodiments of the invention add precise registration to place nanostructures in a predetermined position on a substrate, and make use of prior alignment techniques for placement of nanostructures, e.g., fluidic assisted alignment, electrical (electrophoresis), magnetic field guided alignment, Langmuir-Blodgett technique, and contact transfer methods. The invention allows assembly and transfer of 1D nanostructures to predetermined positions on a substrate (such as a wafer), and therefore allow integration to existing devices in CMOS circuits, Si photonic chip, MEMS system, etc.

Embodiments of the invention provides for precise control of the placement location for 1D nanostructures, by combining a trench registration placement with any number of prior nanowire alignment techniques. Prior alignment techniques that can be used with the trench registration of the invention include but are not limited to the fluidic assisted alignment, electrical (electrophoresis), magnetic field guided alignment, the Langmuir-Blodgett technique, and the contact transfer method.

A preferred embodiment of the invention provides for the transfer and the controlled assembly of nanowires onto a substrate using an alignment technique, e.g., preferably the Langmuir-Blodgett technique, with registration of the nanowires facilitated by lithographically patterned trenches. The precise placement of nanowires can facilitate their use in large scale circuit integrations, such as functional nanodevices, circuit interconnections, etc. in a manner that is compatible with the existing CMOS technology, MEMS technology, Si photonics, etc.

Preferred embodiments of the invention will now be discussed with respect to the drawings. The drawings may include schematic representations, which will be understood by artisans in view of the general knowledge in the art and the description that follows. Features may be exaggerated in the drawings for emphasis, and features may not be to scale.

1D Nanowire Photodetector Devices and Photoconductive Gain Control in Nanowires

High internal gain in 1D nanowire photodetectors of the invention is achieved by control of the internal radial electrical field to inhibit hole and electron recombination and to promote charge carrier flow in the core of a nanowire in response to photons absorbed by the nanowires under an applied longitudinal electric field. The internal electrical field in the 1D nanowires of the invention from centroid to surface due to band bending separate photo-generated electron/holes to nanowire surface and center, which enhances the photodetector efficiency by reducing the recombination of electrons and holes. 1D photodetector devices and circuits of the invention have individual nanowires (i.e., 1D) as the detector, and the individual nanowires can be arranged in circuits. Color photodetector devices are also provided.

The high density of surface states in semiconductor nanowires can trap the photogenerated carriers (for example, holes in ZnO nanowires, as trapped carriers) and the unpaired free carriers are collected by electrodes. Therefore, the free carrier lifetime is extremely long due to the trapping of the photogenerated carriers, and also the free charge carrier transit time can be very short due to the small physical dimensions of the nanowires. The combination of these two properties results in extremely high photoconductive gain, and hence extremely high sensitivity, up to 10,000 times greater than a state-of-the-art commercial InGaAs PIN diode detector.

Visible-blind ZnO nanowire photodetectors with internal photoconductive gain as high as $G\sim10^8$ have been fabricated and characterized in accordance with the invention. The photoconduction mechanism in these devices has been verified over a wide temporal domain, from $10^{-9}$ to $10^2$ seconds, revealing the coexistence of fast ($\tau\sim20$ ns) and slow ($\tau\sim10$ s) components of the carrier relaxation dynamics. The extremely high photoconductive gain is attributed to the presence of oxygen related hole-trap states at the nanowire surface, which prevents charge-carrier recombination and prolongs the photocarrier lifetime, as evidenced by the sensitivity of the photocurrrent to ambient conditions. Surprisingly, this mechanism appears to be effective even at the shortest time scale investigated of t<1 ns. Despite the slow relaxation time, the extremely high internal gain of ZnO nanowire photodetectors results in gain-bandwidth products higher than GB~10 GHz.

The invention has identified that photocarrier relaxation dynamics consist of a fast decay component, in the nanosecond time range, which arises from the fast carrier thermalization and hole-trapping at deep surface states, followed by a persistent photocurrent which decays within several seconds. The persistent photocurrent is leveraged in 1D nanowire photodetctors of the invention. This model is readily generalized to the case of other low-dimensional 1D semiconductors where the high density of surface trap states enhances the photocarrier lifetime.

Figure 1B:
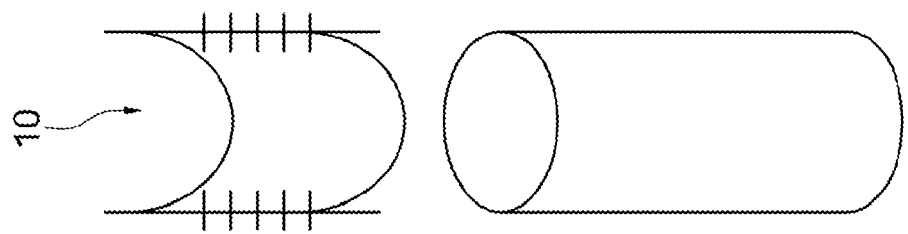
Figure 1A:
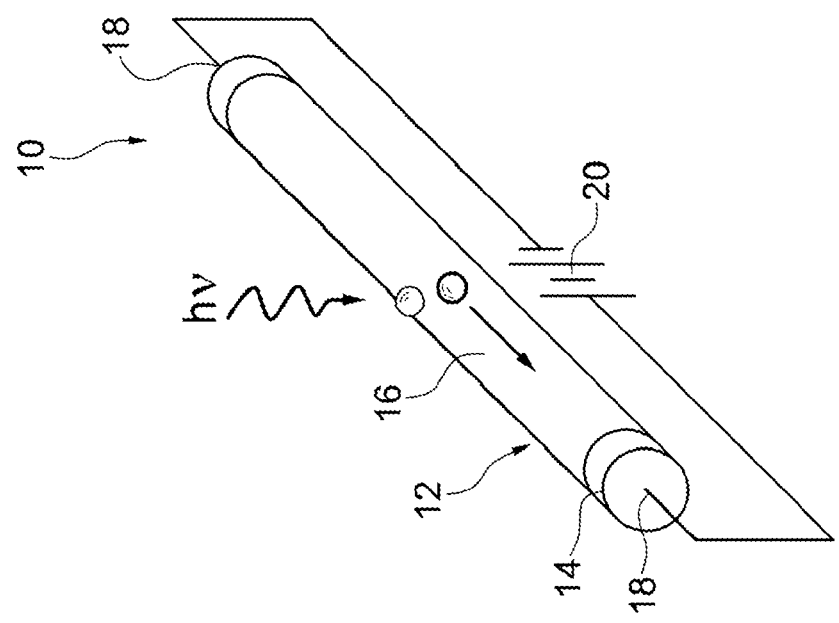

FIGS. 1A-1C illustrate a 1D semiconductor nanowire photodetector 10 of the invention with high internal gain. The photodetector consists of an individual semiconductor nanowire 12 having a free carrier core 14 and trapped carrier shell 16. The core 14 and shell 16 can be created, for example, by doping that varies in the radial direction of the nanowire 12. The nanowire 12 is individually contacted by electrodes 18 that permit an applied bias voltage 20 to create a longitudinal electric field in the nanowire 12 that drives free photogenerated carriers to be collected at electrodes 18. Upon exposure to radiation hv, and application of the bias voltage, high internal photoconductive gain is realized with inhibition of photocarrier recombination.

FIG. 1B shows the 1D nanowire photodetector device 10 in dark. The band diagram indicates the trap states at surfaces and the intrinsic electric fields from centroid to surface. FIG. 1C shows the 1D nanowire photodetector under light. The band diagram indicates the surface states trap holes in the shell 16, leaving behind the electrons in the core 14, which contribute to the photocurrent collected at electrodes.

Embodiments of the invention provide a number of advantages. The high sensitivity of nanowire photodetectors and the low voltage operation enables lowering the operating voltage of providing for simplified circuitry, reducing the manufacture complexity, decreases the pixel sizes, and lowers power consumption.

Figure 2:
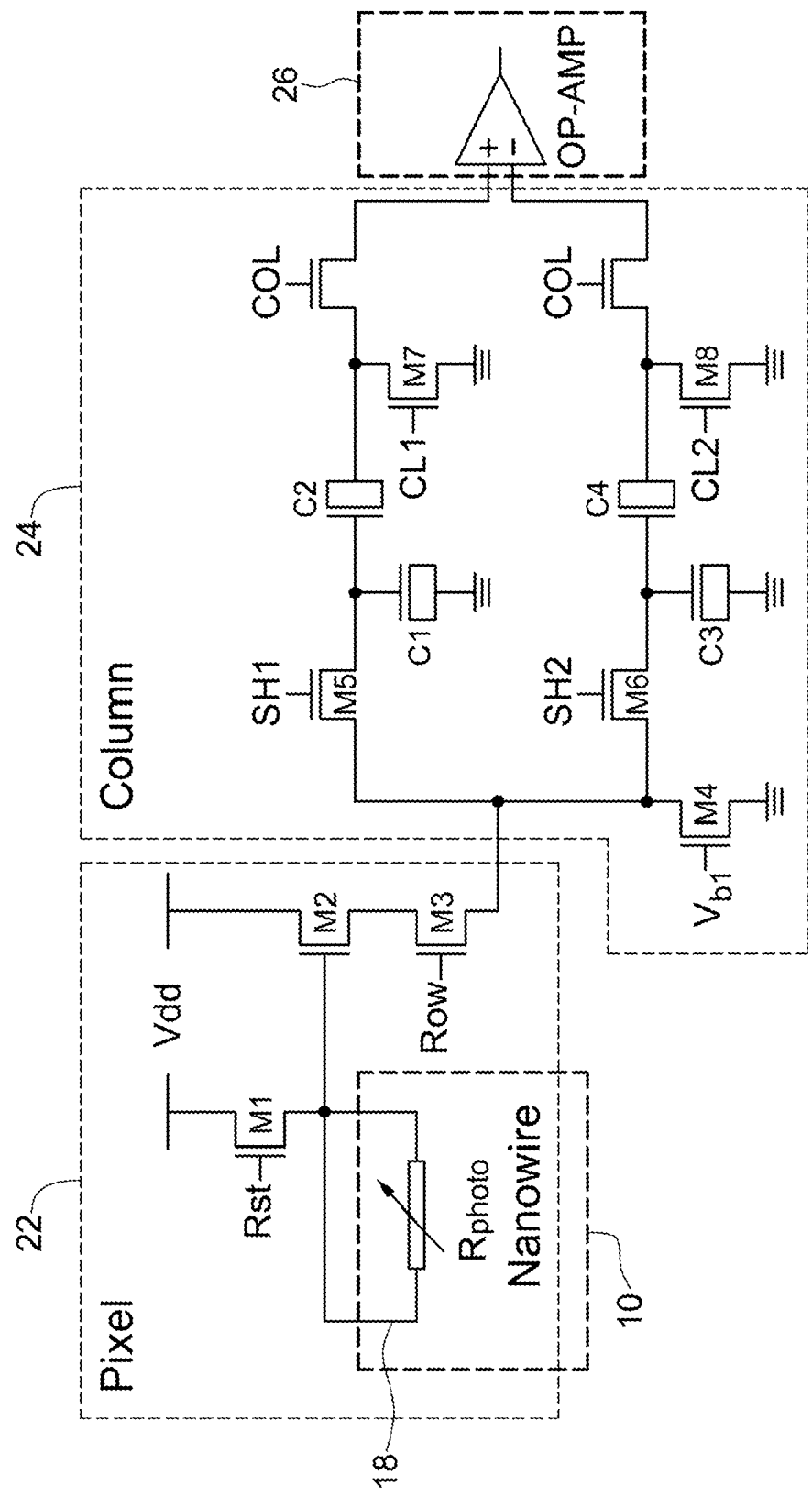
FIG. 2 illustrates a pixel or sub pixel of a preferred embodiment image sensor that uses a 1D nanowire photodetector.

FIG. 2 illustrates a portion of an integrated circuit that is based upon a nanowire photodetector device 10 of the invention. Because the 1D device can be individually contacted by electrodes 18 and registered precisely on a substrate, it can be integrated with conventional CMOS row 22 and column 24 circuitry (For example, see Hsiu-Yu Cheng and Ya-Chin King, IEEE TRANSACTIONS ON ELECTRON DEVICES, 50(1), 91 (2003)). While FIG. 2 illustrates a single pixel (or sub pixel of one color) photodetector, artisans will appreciate that is readily replicable to form a large array. Gain with a 1D nanowire photodetector 10 of the invention can be high enough that it can be possible in applications to omit an op amp 26 typically used in CMOS image sensors. As seen in FIG. 2, the 1D nanowire photodetector 10 of the invention can be precisely registered on a wafer and individually contacted to replace conventional p-i-n photodiodes used in current commercial CMOS image sensors.

An additional advantage provided by the 1D nanowire photodetector 10 is reduced power consumption, which is a key parameter in any portable electronic device. The 1D nanowire photodetector maintains high sensitivity at very low operational voltage to permit reduced power consumption by lowering of operating voltage of imaging devices. Also, the nanowires can be as top mounted to the CMOS circuit surface and the wafer real estate occupied by a 1D nanowire photodetector 10 and its electrode contacts 18 can be smaller than that of a convention p-i-n photodiodes, providing the ability to reduce pixel (and sub pixel) size.

Figure 3B:
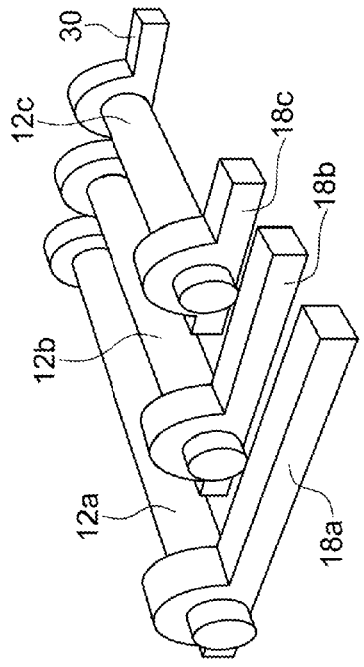
FIGS. 3A-3D illustrate preferred embodiment 1D nanowire photodetector devices for RGB color sensing of the invention.
Figure 3D:
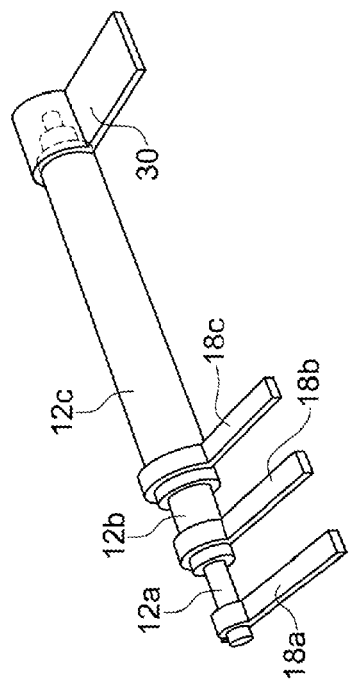
Figure 3A:
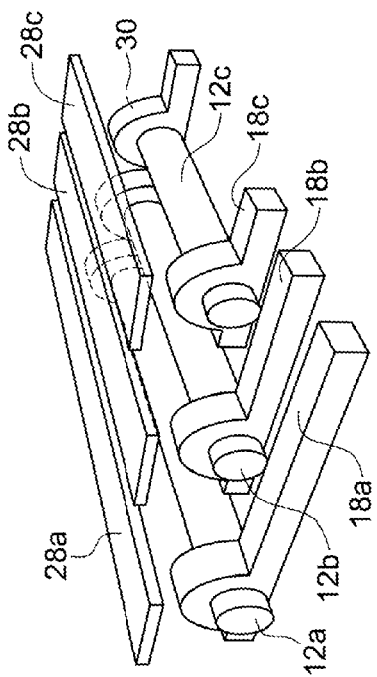
Figure 3C:
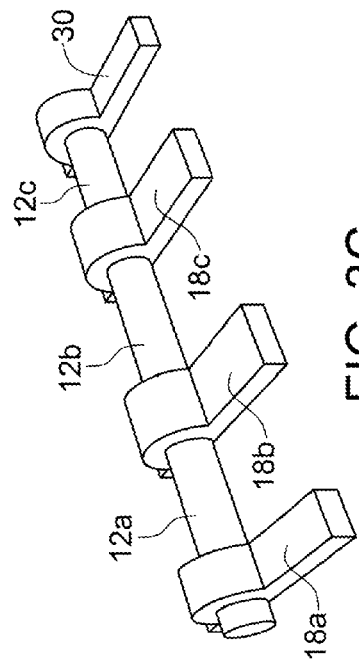

FIGS. 3A-3D illustrate different embodiment devices for RGB color sensing with 1D nanowire photodetctors of the invention. In FIG. 3A, three separate 1D nanowires 12a, 12b, 12c, are aligned and registered with respective red, green and blue color filters 28a, 28b, 28c, and contacted by separate sensing electrodes 18a, 18b, 18c and a common electrode 30. In FIGS. 3B-3D, separate color filters are not necessary because nanowires or portions or nanowires are made color sensitive. This can be accomplished with nanowires of different materials and hence different band gaps, or with nanowires of the same material that are functionalized with different nanoparticles, organic dyes, polymers, etc. In FIG. 3B the three separate 1D nanowires 12a, 12b, and 12c that are aligned and registered are respectively sensitive to red, green and blue wavelengths. In FIG. 3C, three separate 1D nanowire axial segments 12a, 12b, and 12c (part of the same nanowire, or axial nanowire heterostructures) are respectively sensitive to red, green and blue wavelengths. In FIG. 3D, three separate 1D nanowire radial segments 12a, 12b, and 12c (part of the same nanowire, or radial nanowire heterostructures, radial quantum well structures, multiple quantum well structures, superlattices, etc.) are respectively sensitive to red, green and blue wavelengths.

1D nanowire photodetctors placed in predetermined registered positions and individually contacted by electrodes were tested. In preliminary testing of the invention, high photoconductive gain (up to G~$10^8$) and high gain-bandwidth product (up to GB~10 MHz) have been demonstrated in ZnO and InP nanowire photodetectors. Other photosensitive nanowire materials are expected to demonstrate the high internal gain with radial fields applied to inhibit photogenerated carrier recombination.

The performance of the 1D nanowires is strongly influenced by high surface-to-volume ratio trapping at surface states, which drastically affects the transport and photoconduction properties of nanowires. In the presence of a high density of hole-trap states at the nanowire surface, upon illumination with photon energy above the bandgap (Eg), electron-hole pairs are photogenerated and holes are readily trapped at the surface, leaving behind unpaired electrons which increase the conductivity under an applied electric field.

It has been previously shown that in ZnO thin films and nanowires that oxygen gas is adsorbed on the oxide surface and captures the free electrons present in the n-type oxide semiconductor $[O_2(g)+e^-\rightarrow O'_2(ad)]_i$. A low-conductivity depletion layer is formed near the surface; upon illumination at a photon energy above Eg, and electron-hole pairs are photogenerated [$h\nu\rightarrow e^-+h^+$]; holes migrate to the surface along the potential slope produced by band bending and discharge the negatively charged adsorbed oxygen ions $[h^++O_2^{-(ad)}\rightarrow O_2(g)]$ and consequently oxygen is photodesorbed from the surface.

Under an electric field, the unpaired electrons destruct the depletion layer and increase the conductivity, until oxygen gas adsorbed at the surface is ionized and produces holes that can recombine with the unpaired electrons. This mechanism of trapping through oxygen adsorption and desorption in ZnO nanowires augments the high density of trap states usually found in nanowires due to the dangling bonds at the surface, thus enhancing the photoresponse.

In a nanowire, at low incident light intensities, the photocurrent increases linearly with light intensity, consistent with the charge carrier photogeneration efficiency proportional to the absorbed photon flux, while at higher light intensities it deviates below this linearity. The sublinear dependence of the photocurrent on light intensity can be understood assuming that at higher light intensities the number of available oxygen hole-traps present at the surface is increasingly reduced, leading to the saturation of the photoresponse. In this case, the density of free carriers in the nanowire can be expressed as:

$$n = \frac{1}{AL}\frac{F}{1+\sqrt{F/F_0}}T_l \quad (1)$$

where F is the photon absorption rate, $F_0$ is the photon absorption rate at which trap saturation occurs, A and L are the nanowire cross section and length, respectively, and $T_l$ is the carrier lifetime (related to the hole-trapping, oxygen desorption and adsorption mechanism). From the usual expression of the photocurrent ($I_{ph}$), therefore:

$$I_{ph} = qnvA = q\left(\frac{T_l}{T_t}\right)\frac{F}{1+\sqrt{F/F_0}} \quad (2)$$

where q is the elementary charge, n is given by Equation 1 and μV/l is the carrier drift velocity. The best fit to the data obtained by Equation 2 from which $F_0=1.4\times10^6$ s$^{-1}$ has been deduced. The radial electric fields that inhibit free and trapped carrier recombination perform a function that is similar to prior photoconductors with blocking contacts, i.e. with a Schottky barrier at the metal electrode-semiconductor interface, which can exhibit hole-trapping in the reversed-bias junction that shrinks the depletion region and allows tunneling of additional electrons into the photoconductor; if electrons pass multiple times, this mechanism yields photoconductive gain greater than unity. Similarly, suppressed recombination of charge carriers has also been reported in p-i-n diodes with blocking contacts and type II heterojunctions, where the increase of photoresponse times results in large photoconductive gain. The radial electric fields created in 1D nanowire photodetectors of the invention performs a similar function. For example, in a 1D ZnO nanowire photodetector of the invention, holes are efficiently trapped at surface states and multiple electrons passing through the nanowire can lead to photoconductive gain. The gain is defined as the ratio between the number of electrons collected per unit time and the number of absorbed photons per unit time ($G=N_{et}/N_{ph}$); from Equation 2 it follows:

$$G = \frac{I_{ph}}{eF} = \left(\frac{T_l}{T_t}\right)\frac{1}{1+\sqrt{F/F_0}} \quad (3)$$

where the first term on the right-hand side is the usual expression for the gain (the ratio between carrier lifetime and carrier transit time) and the second term accounts for trap saturation at high excitation intensities.

The increased photocarrier lifetime due to the presence of surface states, combined with the decreased carrier transit times due to the reduced dimensionality of the 1D nanowire photodetector devices of the invention, i.e., the small spacing between the electrodes, results in photoconductive gain as high as G=2×$10^8$. As a nonlimiting example, spacing can vary from few tens of nm (lithography limited) to few microns, depending on the active area that one wants to achieve. Reducing the electrode spacing reduces the carrier transit time (hence enhances the gain), but also reduces the light collection area and thus sensitivity.

To determine the charge carrier lifetime, $T_l$, photocurrent relaxation by time-resolved measurements in 1D nanowire photodetectors of the invention was tested. Photocurrent rise upon continuous illumination was measured and the photocurrent decay after removal of incident light, at different applied bias voltages. The testing revealed that photocurrent dynamics is independent of the sign and intensity of the external electric field throughout the whole range of applied fields investigated less than 5V applied. From the best fit to the data obtained by a double-exponential rise and decay functions, a weight-averaged photocurrent rise and decay time constants of $\tau_{rise}$=23 s and $\tau_{decay}$=33 s was determined. From the conventional expression for the 3 dB bandwidth of a photodetector, B=½π$T_l$, and the experimental value of the carrier lifetime (Tl=33 s) calculations for the ZnO nanowires provide B~5×10-3 Hz. Considering Equation 3, the gain-bandwidth product will be given by:

$$GB = \left(\frac{1}{2\pi T_t}\right)\frac{1}{1+\sqrt{\frac{F}{F_0}}} \quad (4)$$

which accounts also for hole-trapping saturation at high excitation influences. Despite the slow photocurrent relaxation time, the high gain values result in large gain-bandwidth products, implying that a significant photo response is expected in the 1D nanowire photodetectors of the invention even at high modulation frequencies. Frequency modulations measurements were also made over a range from 20 to 3000 Hz, and gain values were consistently high, with a gain at 3 KHz measure at $2\times10^6$.

Fabrication and Placement of Nanowires with Registration 1D nanowire photodetector devices of the invention and integration to CMOS circuits of the invention require that individual nanowires be placed in predetermined, registered positions and the groups of nanowires have predetermined, registered positions relative to each other and to electrodes, such as printed circuit electrode patterns. Methods of the invention provide the ability to place individual and groups of nanowires in such predetermined, registered positions.

The nanowires used in methods to provide predetermined, registered placement of the invention can be grown by any of the methods that may be developed for fabrication of nanowires and of those that are currently available, including gas phase syntheses with or without a metal nanoparticle as catalysts using Chemical Vapor Deposition (CVD), Metal Organic Chemical Vapor Deposition (MOCVD), Molecular and Chemical. Beam Epitaxy (MBE and CBE), solution syntheses, template-assisted electrochemical syntheses, etc. After growth, nanowires are removed from the substrates (e.g., by ultrasonication) and dispersed into a liquid (i.e. organic solvents, water etc.). The choice of alloy composition in compound semiconductor nanowires leads to 1D nanowire photodetectors or segments sensitive to designed colors (light wavelength), such as those illustrated in FIGS. 3A-3D.

Single nanowire heterostructures, such as core-shell or core-multishell heterostructures that are doped differently in the core and shell for creating the majority carrier core 14 and minority carrier shell 16 in FIG. 1 can be created by radial growth and doping steps. Similarly, core 14 and radial shell 16 nanowires with different semiconductor materials, including materials having specific spectral response as in FIG. 3D are grown radially from a core nanowire. Core and shell materials can be contacted individually after positioning of the nanowire by selective etching of the shells. Also, alternatively, software analysis of the single 1D nanowire response could be employed to isolate color information from the measurement of correlated parameters.

Alternatively, nanowires can be fabricated using nanofabrication methods including ebeam lithography, nanoimprinting lithography, microcontact printing lithography, focus ion beam lithography, depp UV or x-ray lithography, LIGA, etc. followed by etching down using wet chemistry (wet etching) or physical (ion milling, reactive ion etching) etc.

Figure 4:
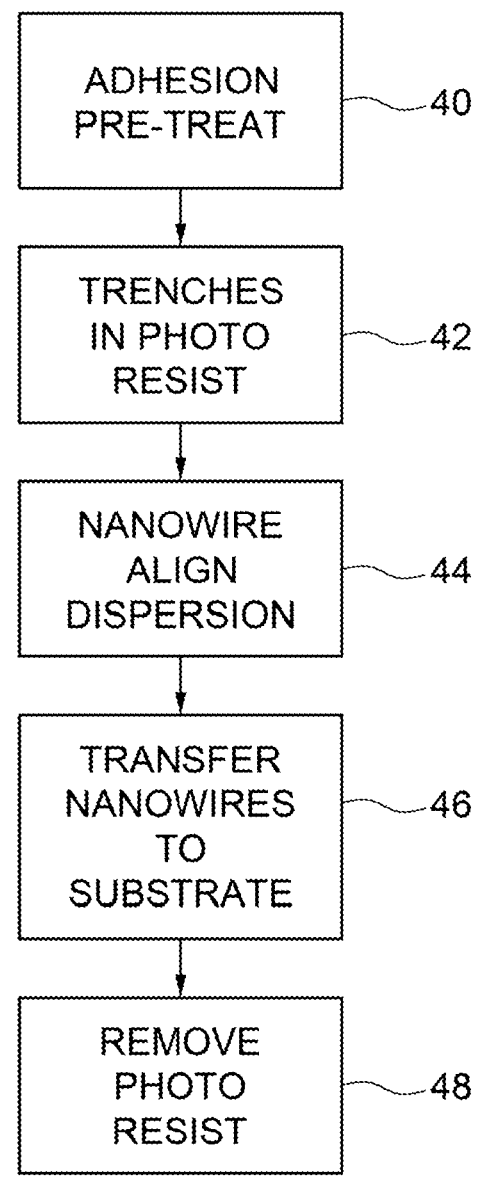
FIG. 4 illustrates a preferred embodiment method for placement of 1D nanowires with predetermined registration.

There are a number of prior nanowire alignment techniques, but these do not allow the precise registered and relative control of the resulting nanowire location on substrate. A preferred embodiment method for such registration is shown in. FIG. 4. In FIG. 4, a substrate is pre-treated 40 for nanowire adhesion. The pretreatment 40 can include, for example, deposition of metallic "sticking pads" or other chemicals that can facilitate nanowire adhesion to the substrate. The substrate is then coated with photoresist patterned 42 with trenches that approximately correspond to the diameters of the nanowires that are to be registered and aligned on the substrate. The trenches can be formed using lithographic methods such as photolithography, e-beam lithography, nanoimprinting lithography, and microcontact printing lithography. Nanowires are aligned in a dispersion 44. The alignment can be accomplished by a number of previous techniques that provide for the parallel alignment of nanowires in a dispersion on the surface of liquid, e.g. i.e. water. In a preferred embodiment, the Langmuir-Blodgett technique is used along with nanowire surface modification via one or more surfactants. The nanowires are then transferred 46 onto the substrate that was pre-patterned with photoresist (step 2), for example by dipping the substrate into the Langmuir-Blodgett trough and using the standard Langmuir-Blodgett transfer technique or Langmuir-Schaeffer technique. The photoresist is then removed 48, e.g., using standard developing methods, resulting in the placement and registration of the nanowires on the substrate in the predefined locations. The nanowire positioning error is around 250 nm$^2$, primarily limited by the resolution of photolithography.

The placement precision relates to the trench dimension and shape. The trenches need to have a certain width so that the nanowires can fall in with minimum positioning variations. For example, a 2 µm long, 50 nm diameter nanowire requires a minimum trench width of 200 nm to accommodate 10% angular misalignment in the Langmuir-Blodgett process. In this case, the FIG. 4 method will produce a maximum positioning error of 100 nm. For a trench width of greater than 0.5 µm that can be easily achieved with conventional UV lithography, the registration error is less than 200 nm for 100 nm diameter nanowires. In the direction of the wires, the interdigitated electrodes essentially define the device geometry.

Other alignment techniques can also be used in step 44. Using fluidic alignment or electrophoretic alignment or contact transfer is possible, for example. For fluidic alignment, the nanowires are dispersed into solution, such as methyl or ethyl alcohol; and the flexible microchannels used for alignment (e.g., PDMS channels) are aligned with the trenches in the photoresist during transfer. When the fluid is circulated in the channels the nanowires can fall into photoresist trenches. For electrophoretic or magnetophoretic alignment, the substrate with photoresist trenches are immersed under the nanowire dispersion solution and the nanowires can fall into the trenches upon application of the electric or magnetic field.

Figure 5:
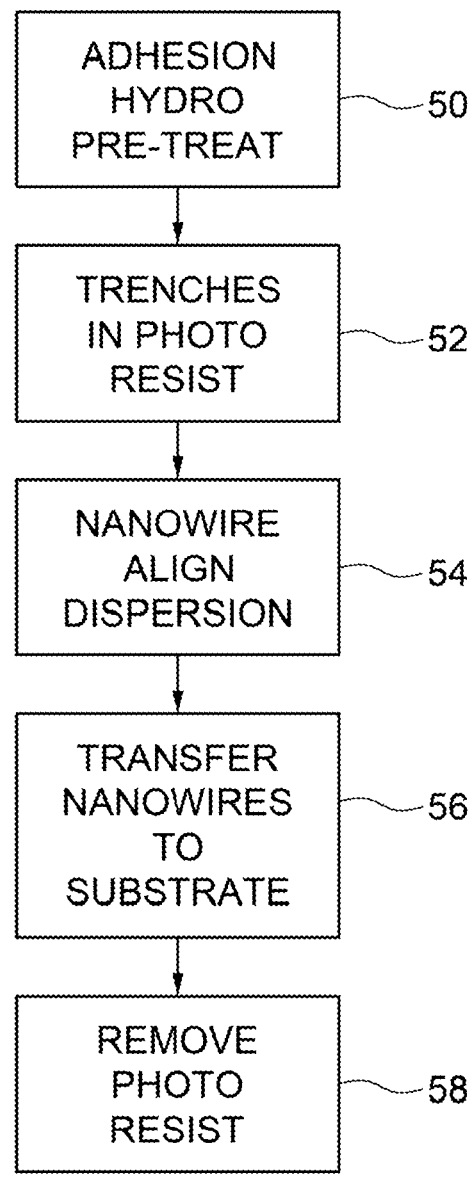
FIG. 5 illustrates another preferred embodiment method for placement of 1D nanowires with predetermined registration.

An alternative method for registered placement of individual 1D nanowires for formation of 1D nanowire photodetectors of the invention is illustrated in FIG. 5. In FIG. 5, pre-treatment of the substrate creates hydrophobic areas 52 or hydrophilic areas. The substrate is then coated with photoresist and trench patterns are defined 52 using lithographic methods, e.g., photolithography, e-beam lithography, nanoimprinting lithography, microcontact printing lithography, etc. The nanowires are aligned and dispersed 54, preferably by Langmuir-Blodgett techniques. The nanowires are then transferred onto the substrate 56, such as by the Langmuir-Blodgett transfer technique or Langmuir-Schaeffer technique.

After nanowires are individually placed in predetermined registered positions, standard techniques can be used to make patterned contacts to the nanowires and form 1D nanowire photodetectors that can be part of a CMOS circuit, for example. After being positioned into predetermined registered positions, the nanowires can be connected to the CMOS circuitry platform by additional photolithography and metallization steps. The metallization can also be combined with the existing metal pads ("sticking pads" patterned onto the CMOS platform to promote selective bonding).

Figure 6B:
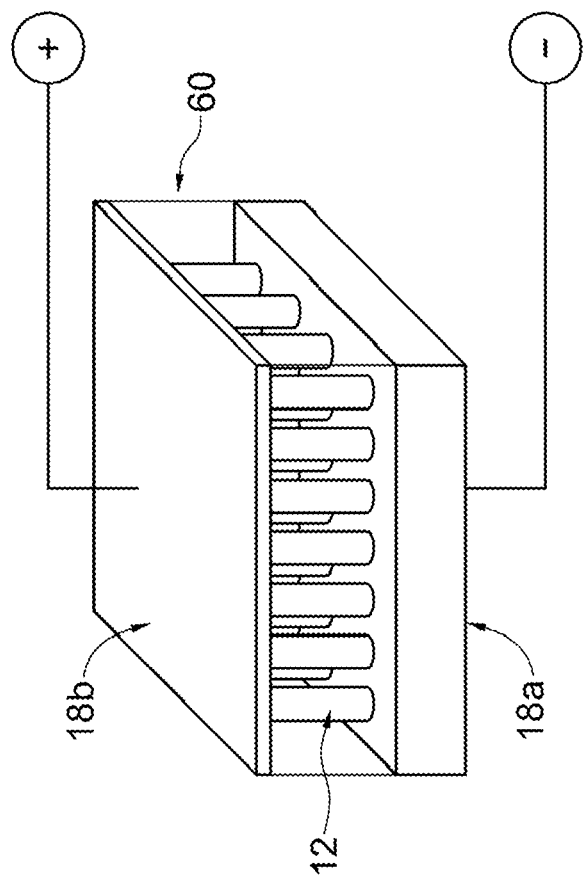
FIG. 6B shows a vertical nanowire photodetector array.
Figure 6A:
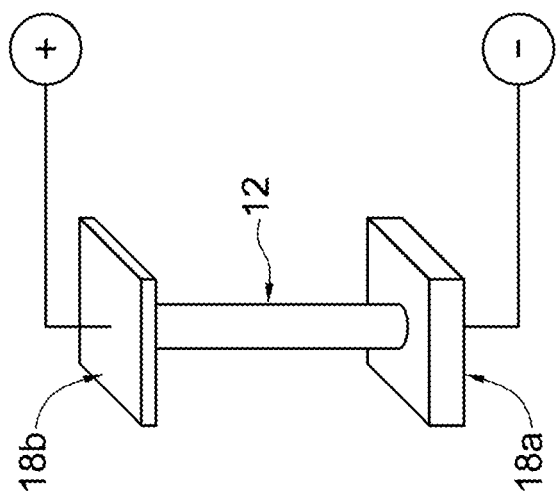
FIG. 6A shows a vertical single nanowire photodetector.

Additional embodiments of the invention provide nanowire photodetectors having a vertical geometry. Such photodetectors include axial and radial heterostructures. Referring now to FIG. 6A, a vertical single nanowire photodetector is shown having the nanowire photoconductor/nanowire heterostructure 12 disposed between a contact electrode 18*a* and a transparent contact electrode 18*b*. FIG. 6B shows a vertical nanowire photodetector array including a two-dimensional array of nanowire photoconductor/nanowire heterostructures 12 disposed between the contact electrode 18*a* and the transparent contact electrode 18*b*. A transparent filling material 60 is also disposed between the contact electrode 18*a* and the transparent contact electrode 18*b*.

Nanowire photodetectors as provided herein may be used for a variety of applications. As nonlimiting examples of additional applications, hyperspectral imagers can be provided, where a nanowire photodetector array or matrix can be utilized in conjunction with a scanning spectrometer. As another example, the RGB embodiments provided herein could be extended to an arbitrary number of wavelengths (colors) to acquire simultaneously spatial and spectral information of an image. Examples include, but are not limited to, UV sensitive solar blind sensor arrays for space application or fire detection in a minefield, etc., IR sensors (e.g., for use in night goggles), etc.

Another example type of device and/or application includes phototransistor structures. In such a phototransistor structure in FIG. 6C, a third terminal (such as a metal electrode 18*c*+dielectric material 18*d*) acts as a gate to tune the photosensitivity (gain) or the response time of the nanowire photodetector.

It will also be appreciated that nanowire positioning methods according to embodiments of the present invention can be used for applications beyond the example photodetectors shown and described herein. Nonlimiting example applications include nanowire field effect transistors, nanowire memories for information storage, nanowire logic gates, metallic nanowires for electrical interconnects, nanowire light emitting diodes and laser diodes, optical intrachip interconnects, nanowire waveguides, gas sensor matrices for electronic noses, nanowire chemical sensors, nanowire biosensors, nanowire mechanical sensors, nanowire MEMS devices, actuators, photovoltaics, nanowire piezoelectrical devices, etc. to be integrated to CMOS circuits, Si photonics, etc. Preferably, for the fabricated lateral and vertical nanowires, nanowire as a function device is positioned during the fabrication processing and no further placement is needed.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A method for placement of 1D nanostructures with registration onto a substrate, the method comprising steps of:
    coating a substrate with a patterning material, and patterning trenches dimensioned to align individual 1D nanostructures in the patterning material at a plurality of predetermined locations for the placement of individual 1D nanostructures in predetermined registered positions with respect to other individual 1D nanostructures;
    aligning the 1D nanostructures in a liquid suspension;
    transferring 1D nanostructures into the trenches from the liquid suspension; and
    removing the patterning material from the substrate.

2. The method of claim 1, wherein:
    the 1D nanostructures comprise 1D nanowires; and
    said steps of aligning and transferring are accomplished with the Langmuir-Blodgett or Langmuir-Schaeffer technique.

3. The method of claim 2, further comprising a preliminary step of treating the substrate to adhere 1D nanowires.

4. The method of claim 1, further comprising:
    incorporating the placed nanostructures to serve as at least one of a photodetector, a field effect transistor, a memory, a logic gate, a metallic interconnect, a light emitting diode, a laser diode, an optical intrachip interconnect, a waveguide, a gas sensor matrix, a chemical sensor, a biosensor, a mechanical sensor, a MEMS device, an actuator, a photovoltaic device, a piezoelectrical device, etc. in a CMOS circuit, or a Si photonic circuit.

5. The method of claim 1, wherein the 1D nanostructures comprise 1D nanowires and the trenches are dimensioned to approximately correspond to diameters of the 1D nanostructures.

6. The method of claim 1, wherein the 1D nanostructures comprise 1D nanowires and the trenches are dimensioned to accommodate a predetermined angular misalignment of said step of aligning.

7. The method of claim 6, wherein said step of aligning comprises the Langmuir-Blodgett or Langmuir-Schaeffer technique and the predetermined angular misalignment comprises 10%.

8. The method of claim 6, wherein said step of aligning comprises fluidic, magnetophoretic or electrophoretic alignment.

9. The method of claim 8, wherein the 1D nanostructures comprise 1D nanowires and said step of aligning comprises fluidic aligning, the fluidic aligning comprising:
    dispersing the nanostructures into solution;
    aligning flexible microchannels with the trenches;
    circulating the solution in the flexible microchannels, and wherein said transferring comprises the nanostructures falling into the trenches from the microchannels.

10. The method of claim 8, wherein the 1D nanostructures comprise 1D nanowires and said step of aligning comprises magnetophoretic or electrophoretic alignment, the magnetophoretic or electrophoretic alignment comprising:
    dispersing the nanostructures into solution; and
    immersing the substrate in the solution; and wherein said transferring comprises applying an electric or magnetic field to promote the nanostructures falling into the trenches.

11. The method of claim 1, further comprising a preliminary step of treating the substrate to create hydrophobic or hydrophilic areas.

12. The method of claim 1, further comprising forming patterned contacts to individual ones of the individual 1D nanostructures.

* * * * *